United States Patent [19]

Mallory et al.

[11] Patent Number: 4,688,148
[45] Date of Patent: Aug. 18, 1987

[54] PACKAGING FOR ELECTRICAL INSTRUMENTS

[75] Inventors: Robert L. Mallory, Portland; Alfred H. Schamel, West Linn, both of Oreg.; Stephen M. Sekel, Vancouver, Wash.

[73] Assignee: Tektronix, Inc., Beaverton, Oreg.

[21] Appl. No.: 872,297

[22] Filed: Jun. 6, 1986

[51] Int. Cl.⁴ .......................... H05K 1/00; H05K 5/02
[52] U.S. Cl. .................................. 361/395; 361/424; 211/41
[58] Field of Search .................. 211/41; 312/183, 253; 361/346, 348, 358, 362, 380, 395, 399, 415, 417, 419, 420, 424, 429

[56] References Cited

U.S. PATENT DOCUMENTS 3,368,150 2/1968 Worcester ........................... 361/424
4,063,788 12/1977 Latasiewicz ........................ 361/395
4,203,147 5/1980 Gabr .................................. 361/424
4,325,103 4/1982 Ito ..................................... 361/424
4,339,628 7/1982 Marcantonio ....................... 361/424

Primary Examiner—G. P. Tolin
Attorney, Agent, or Firm—Robert L. Harrington

[57] ABSTRACT

Packaging for an electrical instrument wherein the electrical field is to be contained in a metal card cage and the card cage enveloped in a plastic shell. Fastening towers or stems are molded in the base portion of the plastic shell and key slotted windows in the card cage drop over the tower and slid under a ledge of the tower to secure the card cage to the base. Main interface circuit boards having keyslots are adapted to interfit the protruded end of the fastening towers. Biased locking lugs enter the slots in the "seated" or "home" positions of both the card cage and circuit board to interlock the three components all without separate fasteners and with a minimum of time and effort.

3 Claims, 4 Drawing Figures

PACKAGING FOR ELECTRICAL INSTRUMENTS

FIELD OF INVENTION

A combination plastic-metal housing for electrical instruments particularly designed for efficient assembly.

BACKGROUND OF THE INVENTION

Electrical instruments of the type herein contemplated (e.g. instruments for testing the electronic functions of automobile engines) are required to be shrouded in metal sheeting referred to as a card cage. The metal card cage constrains and protects the electrical field generated by the instrument's electronics, which is necessary to obtain accurate instrument readings. Whereas the card cage material is necessarily electrically conductive, for many applications of these instruments, the exposed outer shell of the housing is desirably made of a nonconductive material, e.g. plastic.

Heretofore the housing for such electrical instruments included fabricated metal sheeting (for the bottom, top and sides of the card cage). Numerous holes were provided in the sheeting to accommodate screws or press-fit posts used to attach the various electronic components to the card cage, and also to attach the card cage to the outer plastic shell. The assembly process involving the handling and attaching of many individual screws, was time consuming and expensive. The electronic components inside the housing have become less costly and thus the housing assembly has become an satisfactory disproportionate factor in the overall cost of the instrument.

In one attempt to reduce the assembly cost, the more efficient plastic fasteners were utilized in a modified housing wherein the plastic outer shell was first formed and the inner walls were then coated with a metal material. The process of metal coating is however, also very costly and the overall cost was not substantially reduced.

SUMMARY OF THE INVENTION

The present invention solves the problem of disproportionate assembly cost by providing the metal walls of the card cage with configured "windows" or keyholes through which stems formed on the plastic shell are projected. These stems (sometimes hereafter referred to as fastening towers) serve as double duty fasteners. The card cage is affixed to the plastic shell, accomplished by the way the configured windows fit the stems. An extended portion of certain of the stem is formed to mate with slots formed in the electronic components, e.g. a circuit board.

BRIEF DESCRIPTION OF THE DRAWINGS

The invention will be more fully understood by reference to the following detailed description having reference to the accompanying drawings wherein.

DESCRIPTION OF THE PREFERRED EMBODIMENT

Figure 1:
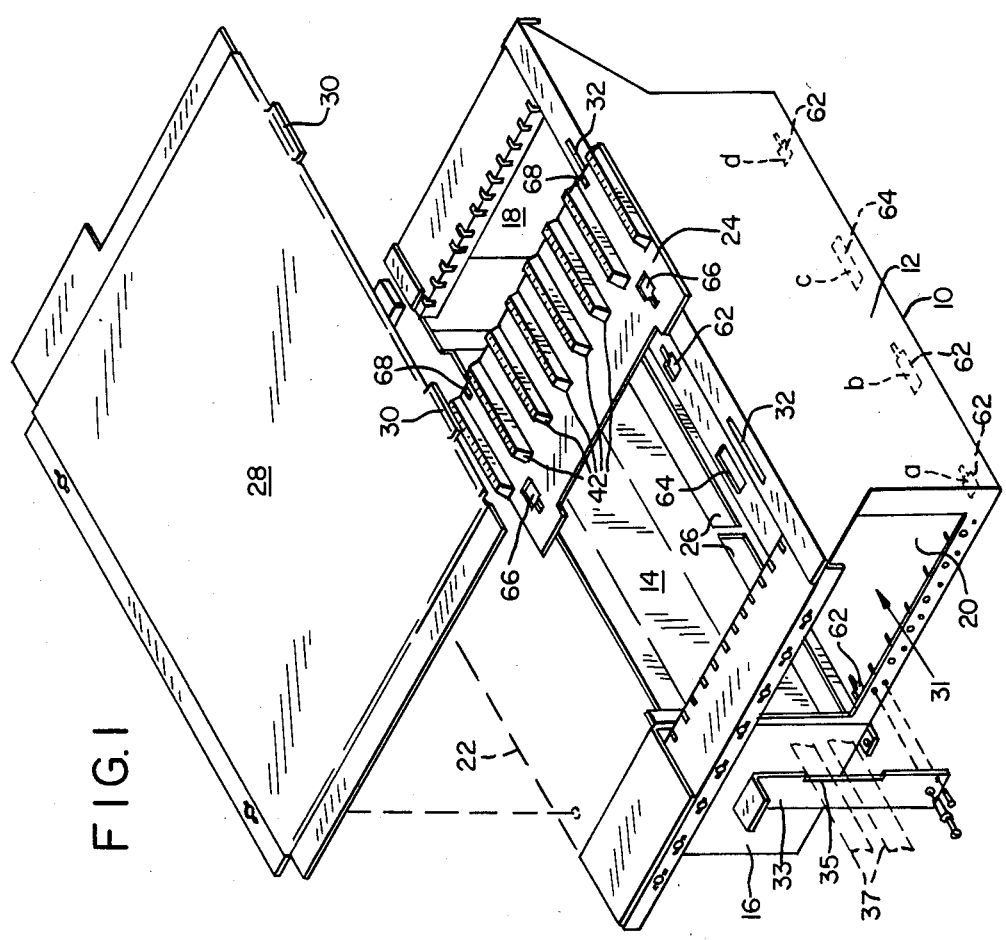
FIG. 1 is a perspective, exploded view of a card cage and a circuit board representing the electronics to be mounted in the card cage.

Reference made to FIG. 1 illustrating a card cage 10 consisting of fabricated metal sheeting formed into side walls 12 and 14, end walls 16 and 18, and bottom wall 20. Side wall 14 is inset to form a cavity in which a power pac unit resides (outlined as a dash line 22). The specific design of the power pac unit is immaterial to this invention and a description thereof is not necessary and accordingly is deleted. It will be sufficient to note that the innerconnection as between the main interface circuit board 24, which is mounted on (or slightly raised over) the bottom wall 20 (as will hereafter be explained) and the power pac unit is achieved through the windows 26 in the side wall 14.

A cover 28 is provided with tabs 30 that fit slots 32 in the side wall 12. The cover is secured in place by $\frac{1}{4}$-turn fasteners that cam into the power pac unit, which in turn is secured to the molded plastic base 34.

End wall 16 has a cutout 31 that provides access to the card cage interior. A series of blank panels 33 (one only of which is shown) are affixed over the cutout 31 to substantially enclose the interior. Depressions 35 in the side of the panels allow cables 37 (in dash lines) to protrude out of the card cage.

Figure 2:
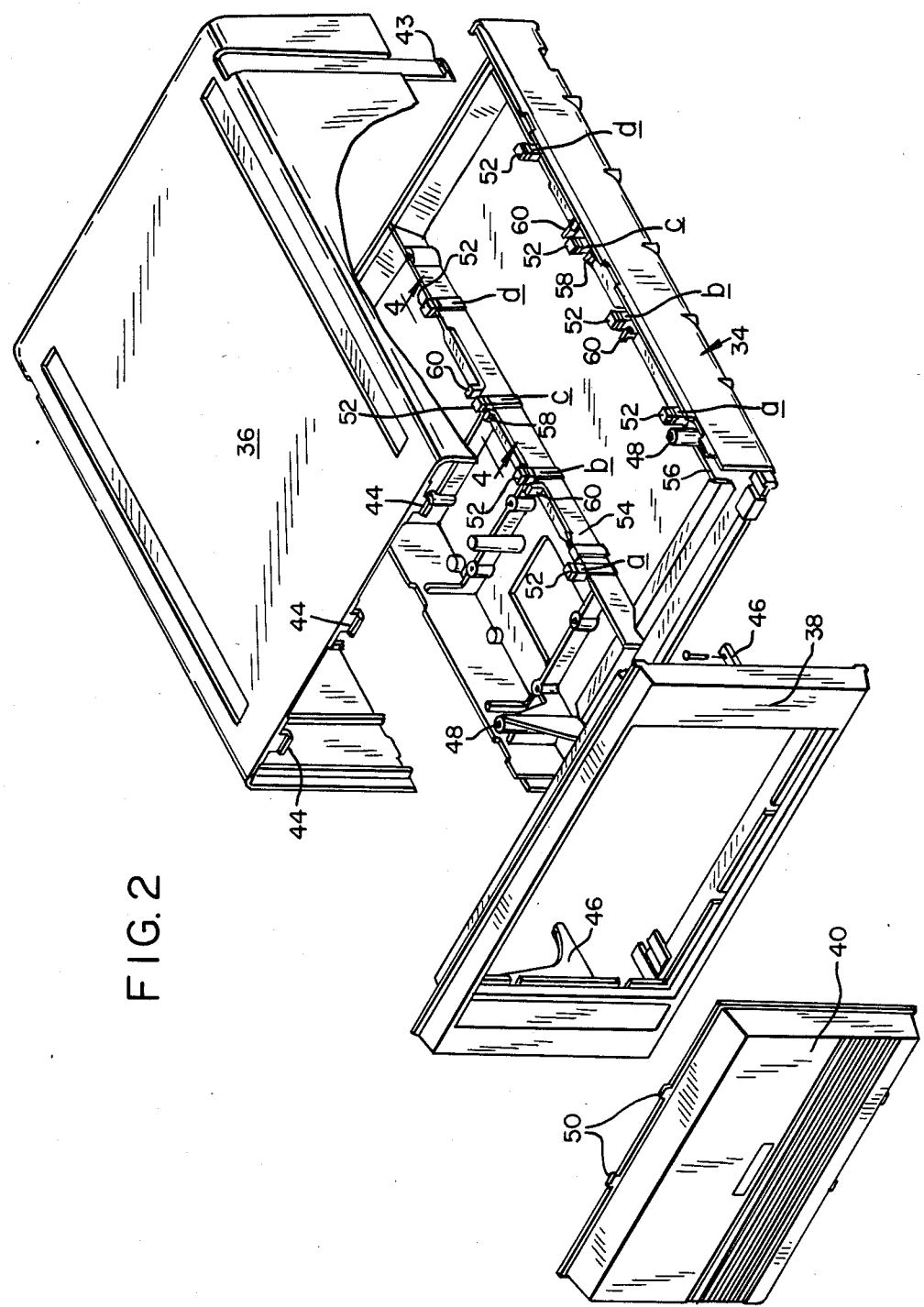
FIG. 2 is a perspective, exploded view of a plastic shell in which the card cage of FIG. 1 is to be mounted.

Reference is now made to FIG. 2 illustrating the components of the outer plastic shell consisting of a base 34, and overcover 36, a front frame member 38 and a front cover 40. The assembly of the various components in FIGS. 1 and 2 involves; mounting the card cage 10 to the base 34; mounting the circuit board 24 to the base 34 (but inside the card cage 10 as will be subsequently explained) and connecting the power pac 22 to the circuit board 24 as the circuit board protrudes through window 26; mounting the plug-in vertical circuit boards to the accommodating receptacles 42 of the main interface board (the plug-in boards are not shown for purposes of clarity); applying the panels 33 over the cutout 31 (with cables 37 projected between the panels as permitted by depressions 35); applying the cover 28 over the card cage 10 and power pac (22); applying the front frame 38 to the front of the base unit (the bottom edge snapping into clips and arms 46 being screwed down into bosses 48); applying the plastic overcover 36 over the entire unit to be attached to the base by clips 43 and 44; and then snap fitting the front cover over the front opening of frame member 38 (by various clips, e.g. clips 50).

The above described components and assembly establishes an arrangement that accommodates the fastening system of the present invention which will hereafter be described. However, the reader is to understand that such an assembly may call for some conventional type fasteners, e.g. the fastening of arms 46 to bosses 48 with screws. It will also be understood that the components may vary in form, type and include additional components, as may be desirable for a particular installation. The assembly herein includes only those components considered to facilitate an understanding and appreciation of the fastening system of the invention, which will now be described.

Reference is made to FIG. 2. Fastening towers 52 are molded into the base 34 along two supporting ribs 54, 56. The towers 52 are provided as pairs at four positions (positions a, b, c and d) spaced front to back along the ribs 54, 56. At position c, forward of the tower 52, is a biased locking lug 58, and rearward of the tower is a biased locking lug 60, the function of which will be explained later herein. A similar locking lug 60 is forward of the tower at position b.

Reference is again made to FIG. 1. In the bottom wall 20 of the card cage 12, key hole slots 62 are provided at positions a, b and d, and rectangular slots 64 are provided at position c. Now refer to the main interface circuit board 24 and note the pair of keyhole slots 66 and the pair of side edge slots 68.

Figure 3:
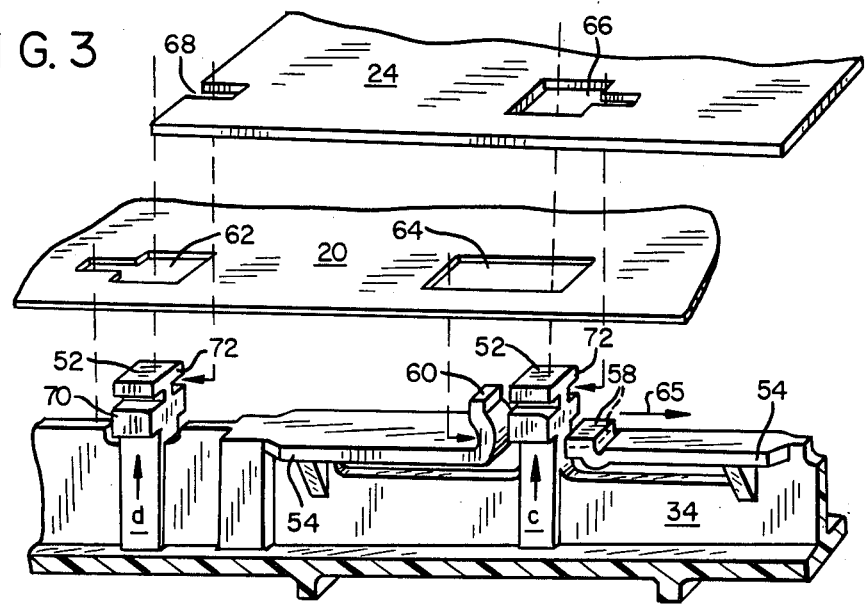
FIG. 3 is a perspective view illustrating the process of attaching the card cage and circuit board of FIG. 1 to the shell of FIG. 2.

Note from FIG. 3 illustrating one tower only of each of the positions c and d, that the attachment of the card cage 10 is achieved by positioning the large opening of slots 62 and slots 64 in bottom wall 20 over the towers 52. The card cage can then be dropped down onto the support ribs 54, 56. Sliding the card cage forward (as indicated by arrow 65) forces the narrow opening of slots 62 under the lower ledge 70 of certain of the towers 52, i.e. at positions a, b and d. This secures the card cage to the base 34. (See also FIG. 4).

Figure 4:
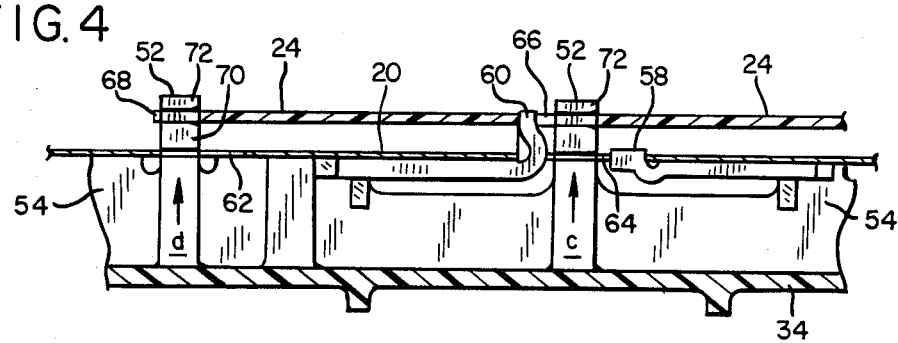
FIG. 4 illustrates the interlocked engagement of circuit board, card cage and outer shell, e.g. as taken on view lines 4—4 of FIG. 2.

Referring now to FIG. 4, the rectangular slots 64 are large enough and located so as to fit over the locking lugs 60 at position c, both before and after sliding the card cage forward on base 34. However, in the initial positioning of the card cage over lug 58, the lug 58 is depressed as indicated in dotted lines. With the card cage slid forward, the lug 58 pops up into the large opening of the slot 64 as illustrated. Reverse movement of the card cage 12 is prevented unless the lug 58 is manually depressed (the dash line position of FIG. 4). Lug 58 thus securely locks the card cage in the forward position, i.e. with the narrow portion of slot 62 under the ledge 70 of the towers 52 at position d as shown, but also at positions a and b.

The procedure for fastening the circuit board 24 to the tower 52 is similar. Note that the circuit board 24 spans only two pairs of the towers 52 and thus is positioned at either positions a and b, or c and d. FIG. 4 illustrates the positions of the circuit board over the towers at positions c and d. The large opening of slots 66 are positioned over the towers and dropped down to a position just under the ledge 72 at position c and slid rearwardly. In the initial positioning of the circuit board, the lug 60 is biased downwardly, and by sliding the board rearward into the "seated" position as shown in FIG. 4, the lug 60 pops up into the opening 66 to prevent reverse movement of the circuit board without first manually depressing the lug 60. This same rearward sliding of the circuit board, slides the narrow side edge slot 68 under the ledges 72 of the towers at position d and because reverse sliding is prevented, the circuit board is securely supported on ledges 70 and under ledges 72 at all four towers of positions c and d.

It will be appreciated that the circuit board 24 can be turned around (so that edge slots 68 face forwardly) and the circuit boards mounted to the towers at positions a and b. In this latter event, the sliding movement for locking the board to the towers will be a forward sliding movement. The location of biased lug 60 at position b is thus forward of the tower 72.

Assembly of an electrical instrument requiring metal shielding and a nonconductive overcover is greatly simplified by the present invention. The mechanism for mechanically locking the components together are principally provided by molding the interlock mechanism into the plastic base, i.e. the towers and biased locking lugs. Producing such mechanism in such a plastic base through the plastic molding process, is well within the capability of the art and a description of the molding process is not necessary and not included herein.

A major achievement of the invention is the provision for attaching the electronics (e.g. the circuit board) directly to the plastic base by providing windows (slots 62, 64) through the metal shielding of the card cage. These windows permit some leakage of the electronic field but such leakage is minimal and does not materially effect the operating capability of the electronics. By additionally forming the windows as key slots, the windows themselves provide the attachment means for attaching the card cage in the base. Thus with the base 34 appropriately formed, i.e., with the towers 52 and lugs 58, 60, attaching the card cage assembly is simply a matter of lining up the slots with the towers, dropping the card cage over the towers and sliding the card cage forward. The main interface circuit board is then appropriately positioned at positions a and b, or c and d, and attached to the towers at these positions. The locking lugs automatically snap into position and the base, card cage, and main interface circuit board are locked together. It is a further advantage that the circuit board, while contained within the protective shield of the card cage, is not directly in contact with the metal walls of the card cage. Problems of transmitted vibration, electrical shortage, etc. that occurs with direct connection between the circuit board and metal card cage sheeting are alleviated.

As is typical of the electronics, the main interface board is adapted to receive hookup to the various electronic components housed in the card cage. With the electronics properly positioned and locked into place, the plastic overcover, front frame and front cover are assembled to the base and the package is completed. This process is essentially accomplished without separate screw and bolts and an assembling worker will complete the entire assembly process within a matter of minutes, e.g., 15 to 20 minutes as compared to two hours for the prior assembly process.

A variety of snaps and fasteners can be incorporated into the concept once it is appreciated that the electronics does not have to be directly attached to the metal card cage, i.e. by providing the access windows. Thus the invention is not limited to the specific embodiment shown but encompasses the packaging concept as defined in the claims appended hereto.

We claim:

1. Packaging for electrical instruments required to be substantially enveloped in metal sheeting with a plastic overcovering, said packaging comprising;

a plastic base, fastening towers of plastic material and configured with first and second fastening means molded into the plastic base, a card cage of metal sheeting having a wall provided with slots configured to interlock with the first fastening means of the towers, said fastening towers projected through the slots of the card cage and in interlocking engagement therewith, a circuit board provided with slots configured to interlock with the second fastening means and fastening the circuit board to a portion of the fastening towers projected through the slots, said first and second fastening means spaced on the tower to space the circuit board from the wall of the card cage, and a plastic overcover fastened to the base over the card cage to envelope the card cage.

2. Packaging as defined in claim 1 wherein said fastening towers are provided with lower and upper ledges and keyway slots formed in said card cage and circuit board are in sliding interlocking engagement with the fastening towers at the lower and upper ledges respectively.

3. Packaging as defined in claim 2 wherein resilient locking lugs are molded into the base adjacent certain of the towers, said locking lugs biased into the slots in the card cage and circuit board and requiring manual depression for reverse sliding movement.

* * * * *